United States Patent
Kuo et al.

(10) Patent No.: US 12,039,710 B2
(45) Date of Patent: Jul. 16, 2024

(54) METHOD FOR IMPROVING EFFICIENCY OF DEFECT DETECTION IN IMAGES, IMAGE DEFECT DETECTION APPARATUS, AND COMPUTER READABLE STORAGE MEDIUM EMPLOYING METHOD

(71) Applicant: HON HAI PRECISION INDUSTRY CO., LTD., New Taipei (TW)

(72) Inventors: Chin-Pin Kuo, New Taipei (TW); Tung-Tso Tsai, New Taipei (TW); Shih-Chao Chien, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 388 days.

(21) Appl. No.: 17/584,736

(22) Filed: Jan. 26, 2022

(65) Prior Publication Data
US 2022/0254002 A1   Aug. 11, 2022

(30) Foreign Application Priority Data
Feb. 5, 2021   (CN) .......................... 202110164687.2

(51) Int. Cl.
*H03M 7/30* (2006.01)
*G06T 7/00* (2017.01)
*G06V 10/77* (2022.01)

(52) U.S. Cl.
CPC .............. *G06T 7/0002* (2013.01); *G06T 7/97* (2017.01); *G06V 10/7715* (2022.01); *H03M 7/3082* (2013.01); *G06T 2207/20081* (2013.01); *G06T 2207/20228* (2013.01)

(58) Field of Classification Search
CPC ......... G06F 18/214; G06T 2207/20081; G06T 2207/20084; G06T 2207/20228; G06T 7/0002; G06T 7/001; G06T 7/97; G06V 10/7715; G06V 10/82; H03M 7/3059; H03M 7/3082
See application file for complete search history.

(56) References Cited

U.S. PATENT DOCUMENTS

| | | | |
|---|---|---|---|
| 2017/0046616 A1* | 2/2017 | Socher .................... | G06N 3/084 |
| 2019/0130279 A1* | 5/2019 | Beggel .................... | G06V 10/82 |
| 2019/0251707 A1* | 8/2019 | Gupta ..................... | G06T 9/002 |
| 2019/0287230 A1* | 9/2019 | Lu .......................... | G06N 3/088 |
| 2019/0320934 A1* | 10/2019 | Odry ..................... | A61B 5/7264 |
| 2019/0377955 A1* | 12/2019 | Swaminathan .. | H04N 21/23418 |
| 2020/0074238 A1* | 3/2020 | Umeno .................. | G06F 18/24 |
| 2020/0372635 A1* | 11/2020 | Veidman ............... | G06T 7/0012 |
| 2020/0388029 A1* | 12/2020 | Saltz ..................... | G06V 10/267 |

(Continued)

*Primary Examiner* — Omar S Ismail
(74) *Attorney, Agent, or Firm* — ScienBiziP, P.C.

(57) ABSTRACT

A method of detecting defects revealed in images of products obtains sample image training data. An underlying feature dimension of an autoencoder is selected and a score is obtained. By comparing the score with a standard score, an optimal underlying feature dimension is confirmed. A test image is inputted into the autoencoder with the optimal underlying feature dimension to obtain a reconstruction image. A reconstruction error between the test image and the reconstruction image is computed. By comparing the reconstruction error with the predefined threshold a result of analysis of the test image is outputted. An image defect detection apparatus and a computer readable storage medium applying the method are also provided.

19 Claims, 4 Drawing Sheets

(56) References Cited

U.S. PATENT DOCUMENTS

| | | | |
|---|---|---|---|
| 2021/0103776 A1* | 4/2021 | Jiang | G06T 19/20 |
| 2021/0256392 A1* | 8/2021 | Chen | G06N 5/01 |
| 2021/0283717 A1* | 9/2021 | Iyer | G06N 3/045 |
| 2021/0374928 A1* | 12/2021 | Hida | G06F 18/2148 |
| 2021/0406698 A1* | 12/2021 | O'Brien | G06F 18/23 |
| 2022/0223293 A1* | 7/2022 | Steinberg-Koch | G06N 3/08 |

* cited by examiner

METHOD FOR IMPROVING EFFICIENCY OF DEFECT DETECTION IN IMAGES, IMAGE DEFECT DETECTION APPARATUS, AND COMPUTER READABLE STORAGE MEDIUM EMPLOYING METHOD

FIELD

The subject matter herein generally relates to image processing, particularly to a method for improving an efficiency of defect detection of images, an image defect detection apparatus, and a computer readable storage medium applying the method.

BACKGROUND

A computing model is used for detecting product defects in images of the products. A method for adjusting a dimension of underlying features of an autoencoder does not set a dimensional size, and an efficiency of the method is low.

Thus, there is room for improvement in the art.

BRIEF DESCRIPTION OF THE DRAWINGS

Implementations of the present disclosure will now be described, by way of example only, with reference to the attached figures.

DETAILED DESCRIPTION

The present disclosure is described with reference to accompanying drawings and the embodiments. It will be understood that the specific embodiments described herein are merely part of all embodiments, not all the embodiments. Based on the embodiments of the present disclosure, it is understandable to a person skilled in the art, any other embodiments obtained by persons skilled in the art without creative effort shall all fall into the scope of the present disclosure. It will be understood that the specific embodiments described herein are merely some embodiments and not all.

Unless otherwise expressly stated, all technical and scientific terminology of the present disclosure are the same as understood by persons skilled in the art. The terminology used in the description of the various described embodiments herein is for the purpose of describing particular embodiments only and is not intended to be limiting.

Figure 4:
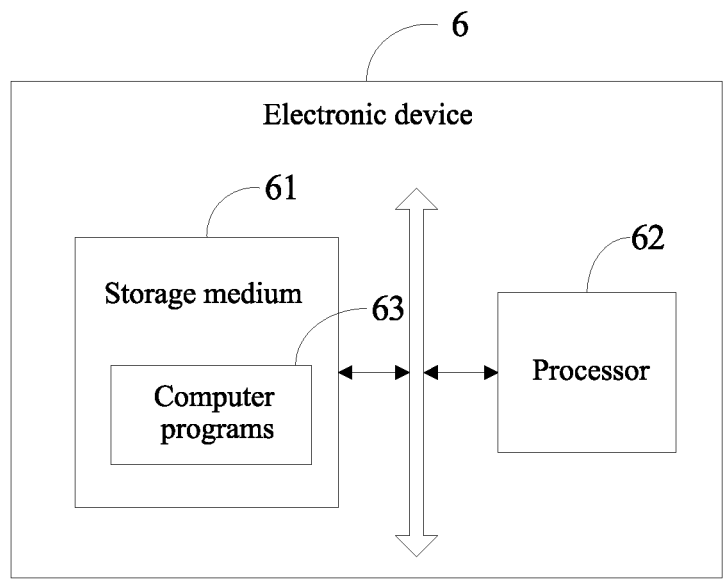
FIG. 4 is a diagram illustrating an embodiment of an electronic device according to the present disclosure.

Preferably, a method of detecting defects in images of products of the present disclosure is used in one or more electronic device 6 (as shown in FIG. 4). The electronic device 6 can automatically compute values and/or information based on preset or stored instructions. The electronic device 6 can include a microprocessor, an application specific integrated circuit (ASIC), a field-programmable gate array (FPGA), a digital signal processor (DSP), an embedded device, and the like.

The electronic device 6 can be a desktop computer, a notebook, a tablet computer, and a cloud terminal server, and the like. The electronic device 6 can interact with human through a keyboard, a mouse, a remote controller, a touch panel, a voice-activated device, and the like.

Embodiment One

Figure 1:
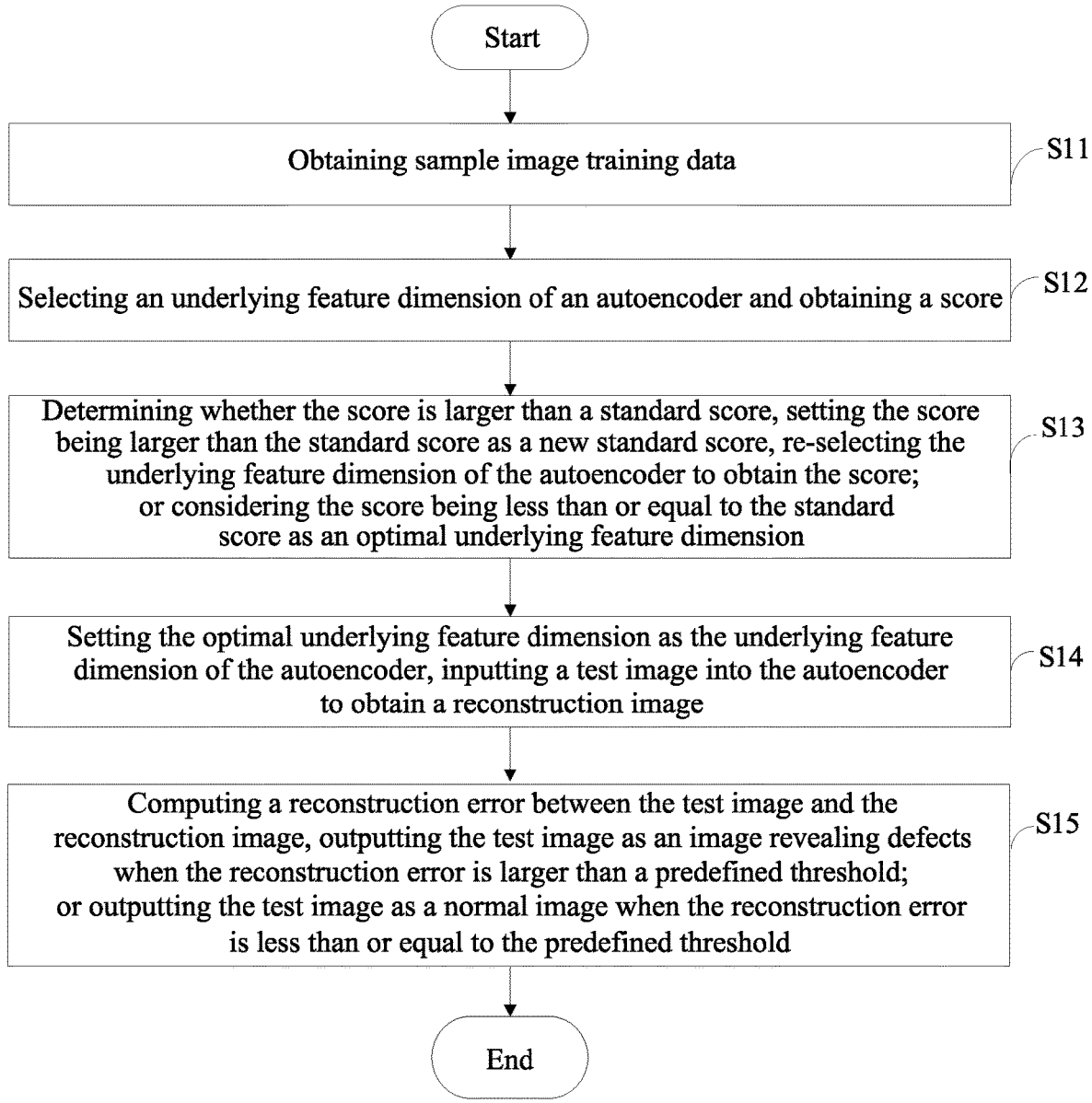
FIG. 1 is a flowchart illustrating an embodiment of a method of detecting product defects revealed in images according to the present disclosure.

FIG. 1 shows a flowchart of a method for detecting defects revealed in images. The method is used in the electronic device 6. Due to different requirements, a sequence of steps in the flowchart diagram can be changed, and some steps can be omitted. The method includes the following steps, these steps may be re-ordered:

In block S11, sample image training data are obtained.

In one embodiment, the sample image training data includes defect sample training images and normal sample training images.

In block S12, a underlying feature dimension of an autoencoder is selected and a score is obtained.

In one embodiment, the step of selecting the underlying feature dimension of the autoencoder and obtaining the score includes:

In block S21, the underlying feature dimension of the autoencoder is set.

In one embodiment, the step of setting the underlying feature dimension of the autoencoder includes:

The dimension of the underlying feature extracted from an encoding layer of the autoencoder is set. In one embodiment, the autoencoder extracts the underlying feature based on image data.

In block S22, the autoencoder is trained by the sample image training data to obtain a trained autoencoder.

In one embodiment, the step of training the autoencoder by the sample image training data to obtain the trained autoencoder includes:

The sample image training data is vectorized to obtain first feature vectors of the sample image training data.

The first vectors are computed by the encoding layer of the autoencoder to obtain the underlying features of the sample image training data.

The underlying features are computed by the encoding layer of the autoencoder and the computed underlying features are restored.

The autoencoder is optimized to obtain the trained autoencoder.

In one embodiment, the dimensions of the underlying features of the sample image training data are same as the dimensions of the underlying features of the autoencoder set in the block S21.

The step of optimizing the autoencoder to obtain the trained autoencoder includes:

A loss function is set and the autoencoder is trained by a minimized loss function to obtain the trained autoencoder. In one embodiment, the loss function can include a cross entropy function or a mean square error function.

In block S23, the normal sample image data and the defect sample image data are inputted into the trained autoencoder respectively to obtain the underlying features of the normal sample image data and the underlying features of the defect sample image data.

In one embodiment, the step of inputting the normal sample image data and the defect sample image data into the trained autoencoder respectively to obtain the underlying features of the normal sample image data and the underlying features of the defect sample image data includes:

The normal sample image data is inputted into the trained autoencoder, and the underlying features of the normal sample image data are obtained by the encoding layer of the trained autoencoder. The defect sample image data is inputted into the trained autoencoder, and the underlying features of the defect sample image data are obtained by the encoding layer of the trained autoencoder.

In one embodiment, the dimensions of the underlying features of the normal sample image data are the same as the dimensions of the underlying features of the autoencoder set in the block S21, and the dimensions of the underlying features of the defect sample image data are the same as the dimensions of the underlying features of the autoencoder set in the block S21.

In block S24, the dimensions of the underlying features of the normal sample image data are reduced to obtain first underlying features corresponding to the normal sample image data, and the dimensions of the underlying features of the defect sample image data are reduced to obtain second underlying features corresponding to the defect sample image data.

In one embodiment, the step of reducing the dimensions of the underlying features of the normal sample image data to obtain first underlying features corresponding to the normal sample image data, and reducing the dimensions of the underlying features of the defect sample image data to obtain second underlying features corresponding to the defect sample image data includes:

The dimensions of the underlying features of the normal sample image data are reduced by a t-distributed stochastic neighbor embedding (t-SNE) algorithm to obtain the first underlying features corresponding to the normal sample image data, the dimensions of the underlying features of the defect sample image data are reduced by the t-SNE algorithm to obtain the second underlying features corresponding to the defect sample image data.

In one embodiment, the step of reducing the dimensions of the underlying features of the normal sample image data by the t-SNE to obtain the first underlying features corresponding to the normal sample image data includes:

A Gaussian probability distribution matrix P1 of the underlying features of the normal sample image data is solved.

A low dimension feature Y1 is randomly initialized, and the t-distribution matrix Q1 of the low dimension feature Y1 is solved. The low dimension feature Y1 is a vector generated randomly, and the dimension of the low dimension feature Y1 is the same as the dimension of the underlying feature dimension of the autoencoder set in the block S11.

A KL divergence of the Gaussian probability distribution matrix P1 and the t-distribution matrix Q1 serves as the loss function. The low dimension feature Y1 is solved by iteration computation using gradient descent method based on the loss function. The obtained low dimension feature Y1 after the iteration of the low dimension feature Y1 serves as the first underlying features.

In one embodiment, the step of reducing the dimensions of the underlying features of the normal sample image data to obtain the second underlying features corresponding to the defect sample image data includes:

A Gaussian probability distribution matrix P2 of the underlying features of the defect sample image data is solved.

A low dimension feature Y2 is randomly initialized, and the t-distribution matrix Q2 of the low dimension feature Y2 is solved. The low dimension feature Y2 is a vector generated randomly, and the dimension of the low dimension feature Y2 is the same as the dimension of the underlying feature dimension of the autoencoder set in the block S11.

A KL divergence of the Gaussian probability distribution matrix P2 and the t-distribution matrix Q2 serves as the loss function, the low dimension feature Y2 is solved by iteration computation using gradient descent method based on the loss function. The obtained low dimension feature Y2 after the iteration of the low dimension feature Y2 serves as the second underlying features.

In block S25, the first underlying features are computed to obtain distribution central points of each of first underlying features.

In one embodiment, the step of computing the first underlying features to obtain the distribution central points of each of first underlying features includes:

An average value in each dimension of three dimensions of each first underlying feature is computed, points corresponding to coordinates combined by the average values of the three dimensions serve as the distribution central points of the first underlying features.

For example, the coordinates of the first underlying features $[A_1, A_2, \ldots, A_n]$ are $[(x_1, y_1, z_1), (x_2, y_2, z_2), \ldots, (x_N, y_N, z_N)]$, the coordinates of each of the distribution central points corresponding to the first underlying features $[A_1, A_2, \ldots, A_n]$ are $$\left( \frac{\sum_{i=1}^{N} x_i}{N}, \frac{\sum_{i=1}^{N} y_i}{N}, \frac{\sum_{i=1}^{N} z_i}{N} \right).$$

In block S26, a distance between each second underlying feature and the corresponding distribution central point is computed, and the distances are added together to obtain the score.

In one embodiment, the step of computing a distance between each second underlying feature and the corresponding distribution central point and adding the distances together to obtain the score includes:

A Euclidean distance between each second underlying feature and the corresponding distribution central point is computed, adding the Euclidean distances together to obtain the score.

For example, the coordinates of the second underlying features $[B_1, B_2, \ldots, B_n]$ are $[(X_1, Y_1, Z_1), (X_2, Y_2, Z_2), \ldots, (X_N, Y_N, Z_N)]$, the Euclidean distance between the second underlying feature $B_j$, $(X_j, Y_j, Z_j)$ and the distribution central point $$\left( \frac{\sum_{i=1}^{N} x_i}{N}, \frac{\sum_{i=1}^{N} y_i}{N}, \frac{\sum_{i=1}^{N} z_i}{N} \right)$$

are $$\sqrt[2]{\left(X_j - \frac{\sum_{i=1}^{N} x_i}{N}\right)^2 + \left(Y_j - \frac{\sum_{i=1}^{N} y_i}{N}\right)^2 + \left(Z_j - \frac{\sum_{i=1}^{N} z_i}{N}\right)^2}.$$

The score is $$\sum_{j=1}^{N}\left(\sqrt[2]{\left(X_j - \frac{\sum_{i=1}^{N} x_i}{N}\right)^2 + \left(Y_j - \frac{\sum_{i=1}^{N} y_i}{N}\right)^2 + \left(Z_j - \frac{\sum_{i=1}^{N} z_i}{N}\right)^2}\right).$$

In block S13, whether the score is larger than a standard score is determined, a score being larger than the standard score is set as a new standard score, the underlying feature dimension of the autoencoder is re-selected to obtain the score; the score being less than or equal to the standard score is considered as an optimal underlying feature dimension.

In block S14, the optimal underlay feature dimension is set as the underlying feature dimension of the autoencoder, and a test image is inputted into the autoencoder to obtain a reconstruction image.

In one embodiment, the step of inputting the test image training data into the autoencoder to obtain the reconstruction image includes:

The test image is vectorized to obtain a second feature vector of the test image.

The second feature vector is computed by the encoding layer of the autoencoder to obtain underlying feature of the test image.

The underlying feature of the test image is computed by the encoding layer of the autoencoder and the computed underlying feature is restored to obtain the reconstruction image.

In block S15, a reconstruction error between the test image and the reconstruction image is computed, the test image is outputted as an image revealing defects when the reconstruction error is larger than a predefined threshold; or the test image is outputted as a normal image when the reconstruction error is less than or equal to the predefined threshold.

In one embodiment, the step of computing the reconstruction error between the test image and the reconstruction image includes:

A mean square error of the test image and the reconstruction image is computed, and the mean square error serves as the reconstruction error.

In other embodiments, the step of computing the reconstruction error between the test image and the reconstruction image includes:

A cross entropy of the test image and the reconstruction image is computed, and the cross entropy serves as the reconstruction error.

Based on the method of the present disclosure, the underlying feature dimension with a discernibility ability can be efficiently confirmed, and an efficiency of the detecting the defects in the images is improved.

Embodiment Two

Figure 3:
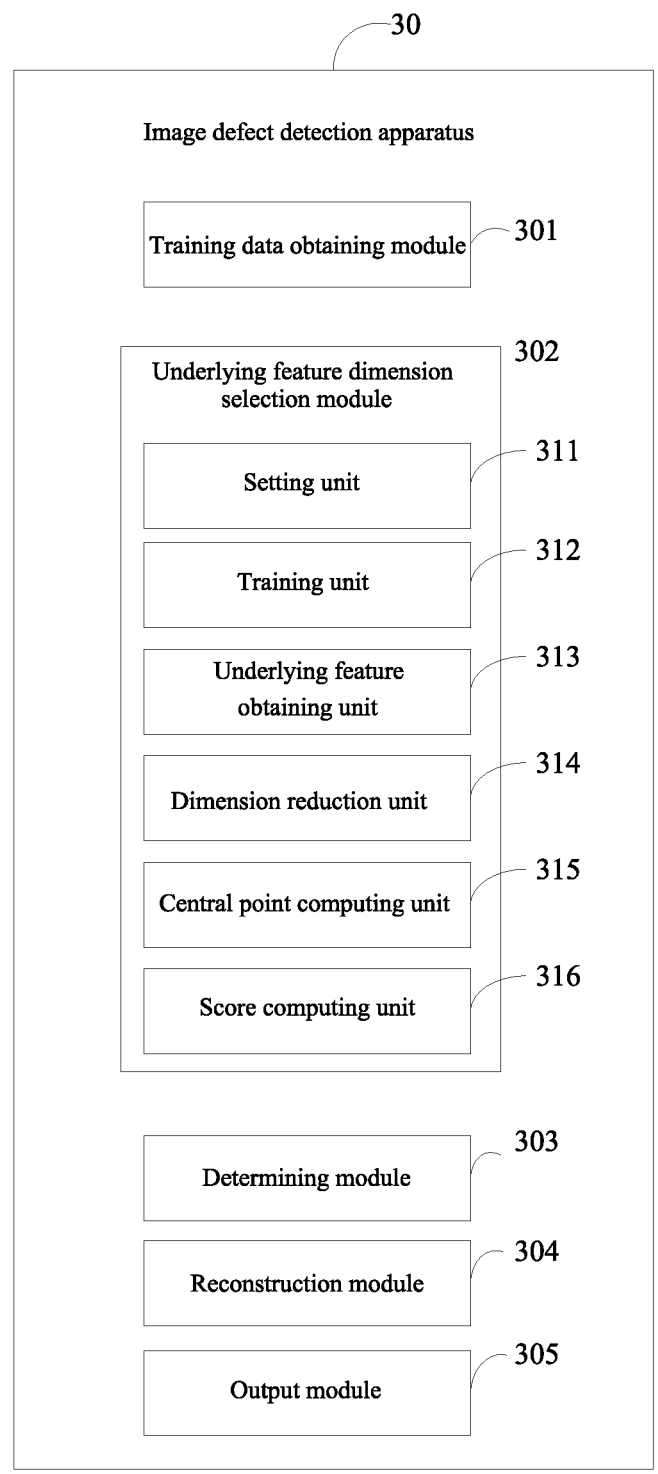
FIG. 3 is a diagram illustrating an embodiment of a defect detection apparatus according to the present disclosure.

As shown in FIG. 3, an image defect detection apparatus 30 is operated in an electronic device 6. The image defect detection apparatus 30 can include multiple function modules, which are composed by program code sections. Program codes in each program code section can be stored in a storage medium 61 (as shown in FIG. 4), which is executed by at least one processor 62 (as shown in FIG. 4) for implementing an image defect detection function.

In one embodiment, the function modules in the image defect detection apparatus 30 are divided by functions. As shown in FIG. 3, the image defect detection apparatus 30 includes a training data obtaining module 301, an underlying feature dimension selection module 302, a determining module 303, a reconstruction module 304, and an output module 305. Each module of the present disclosure means multiple computer program sections stored in the storage medium 61, which are executed by the at least one processor 62 to accomplish a fixed function. In one embodiment, the functions of the modules are described as below.

The training data obtaining module 301 obtains sample image training data.

In one embodiment, the sample image training data includes defect sample training images and normal sample training images.

The underlying feature dimension selection module 302 selects an underlying feature dimension of an autoencoder and obtains a score.

In one embodiment, the underlying feature dimension selection module 302 includes a setting unit 311, a training unit 312, an underlying feature obtaining unit 313, a dimension reduction unit 314, a central point computing unit 315, and a score computing unit 316.

The setting unit 311 sets the underlying feature dimension of the autoencoder.

In one embodiment, while setting the underlying feature dimension of the autoencoder, the setting unit 311 sets the dimension of the underlying feature extracted from an encoding layer of the autoencoder. In one embodiment, the autoencoder extracts the underlying feature based on image data.

The training unit 312 trains the autoencoder by the sample image training data to obtain a trained autoencoder.

In one embodiment, while training the autoencoder by the sample image training data to obtain the trained autoencoder, the training unit 312 vectorizes the sample image training data to obtain first feature vectors of the sample image training data. The training unit 312 further computes the first vectors by the encoding layer of the autoencoder to obtain the underlying features of the sample image training data. The training unit 312 further computes the underlying features by the encoding layer of the autoencoder and restores the computed underlying features. The training unit 312 optimizes the autoencoder to obtain the trained autoencoder.

In one embodiment, the dimensions of the underlying features of the sample image training data are same as the dimensions of the underlying features of the autoencoder set by the setting unit 311.

While optimizing the autoencoder to obtain the trained autoencoder, the training unit 312 further sets a loss function and trains the autoencoder by a minimized loss function to obtain the trained autoencoder. In one embodiment, the loss function can include a cross entropy function or a mean square error function.

The underlying feature obtaining unit 313 inputs the normal sample image data and the defect sample image data into the trained autoencoder respectively to obtain the underlying features of the normal sample image data and the underlying features of the defect sample image data.

In one embodiment, the normal sample image data is inputted into the trained autoencoder, and the underlying feature obtaining unit 313 obtains the underlying features of the normal sample image data by the encoding layer of the trained autoencoder. The defect sample image data is inputted into the trained autoencoder, and the underlying feature obtaining unit 313 obtains underlying features of the defect sample image data by the encoding layer of the trained autoencoder.

In one embodiment, the dimensions of the underlying features of the normal sample image data are the same as the dimensions of the underlying features of the autoencoder set in the block S21, and the dimensions of the underlying features of the defect sample image data are the same as the dimensions of the underlying features of the autoencoder set by the setting unit 311.

The dimension reduction unit 314 reduces the dimension of the underlying feature of the normal sample image data to obtain first underlying features corresponding to the normal sample image data, and reduces the dimension of the underlying feature of the defect sample image data to obtain second underlying features corresponding to the defect sample image data.

In one embodiment, during the above operation, the dimension reduction unit 314 reduces the dimensions of the underlying features of the normal sample image data by a t-distributed stochastic neighbor embedding (t-SNE) algorithm to obtain the first underlying features corresponding to the normal sample image data. The dimension reduction unit 314 further reduces the dimensions of the underlying features of the defect sample image data by the t-SNE algorithm to obtain the second underlying features corresponding to the defect sample image data.

In one embodiment, during the above operation, the dimension reduction unit 314 solves a Gaussian probability distribution matrix P1 of the underlying features of the normal sample image data.

The dimension reduction unit 314 randomly initializes a low dimension feature Y1, and solves the t-distribution matrix Q1 of the low dimension feature Y1. The low dimension feature Y1 is a vector generated randomly, and the dimension of the low dimension feature Y1 is the same as the dimension of the underlying feature dimension of the autoencoder set by the setting unit 311.

The dimension reduction unit 314 serves a KL divergence of the Gaussian probability distribution matrix P1 and the t-distribution matrix Q1 as a loss function. The dimension reduction unit 314 solves the low dimension feature Y1 by iteration computation using gradient descent method based on the loss function. The obtained low dimension feature Y1 after the iteration of the low dimension feature Y1 serves as the first underlying features.

In one embodiment, during the above operation, the dimension reduction unit 314 further solves a Gaussian probability distribution matrix P2 of the underlying features of the defect sample image data.

The dimension reduction unit 314 randomly initializes a low dimension feature Y2, and solves the t-distribution matrix Q2 of the low dimension feature Y2. The low dimension feature Y2 is a vector generated randomly, and the dimension of the low dimension feature Y2 is the same as the dimension of the underlying feature dimension of the autoencoder set by the setting unit 311.

The dimension reduction unit 314 serves a KL divergence of the Gaussian probability distribution matrix P2 and the t-distribution matrix Q2 as a loss function. The dimension reduction unit 314 solves the low dimension feature Y2 by iteration computation using gradient descent method based on the loss function. The obtained low dimension feature Y2 after the iteration of the low dimension feature Y2 serves as the second underlying features.

The central point computing unit 315 computes the first underlying features to obtain distribution central points of each of first underlying features.

In one embodiment, while computing the first underlying features to obtain distribution central points of each of first underlying features, the central point computing unit 315 further computes an average value in each dimension of three dimensions of each first underlying feature. Points corresponding to coordinates combined by the average values of the three dimensions serve as the distribution central points of the first underlying features.

The score computing unit 316 computes a distance between each second underlying feature and the corresponding distribution central point, and adds the distances to obtain the score In one embodiment, during computing operation, the score computing unit 316 computes a Euclidean distance between each second underlying feature and the corresponding distribution central point, and adds the Euclidean distances together to obtain the score.

The determining module 303 determines whether the score is larger than a standard score. A score being larger than the standard score is set as a new standard score, the underlying feature dimension selection module 302 is recalled. The score being less than or equal to the standard score is considered as an optimal underlying feature dimension.

The reconstruction module 304 sets the optimal underlay feature dimension as the underlying feature dimension of the autoencoder, and inputs a test image into the autoencoder to obtain a reconstruction image.

In one embodiment, during the inputting operation, the reconstruction module 304 vectorizes the test image to obtain a second feature vector of the test image, and computes the second feature vector by the encoding layer of the autoencoder to obtain underlying feature of the test image. The reconstruction module 304 further computes the underlying feature of the test image by the encoding layer of the autoencoder and restores the computed underlying feature to obtain the reconstruction image.

The output module 305 computes a reconstruction error between the test image and the reconstruction image. When the reconstruction error is larger than a predefined threshold, the output module 305 outputs the test image as an image revealing defects. When the reconstruction error is less than or equal to the predefined threshold, the output module 305 outputs the test image as a normal image.

In one embodiment, while computing the reconstruction error, the output module 305 computes a mean square error of the test image and the reconstruction image. The mean square error serves as the reconstruction error.

In other embodiments, while computing the reconstruction error, the output module 305 computes a cross entropy of the test image and the reconstruction image. The cross entropy serves as the reconstruction error.

Based on the image defect detection apparatus 30 of the present disclosure, the underlying feature dimension with an ability to discern can be efficiently confirmed, and an efficiency of the detecting the defects in the images is improved.

Embodiment Three

Figure 2:
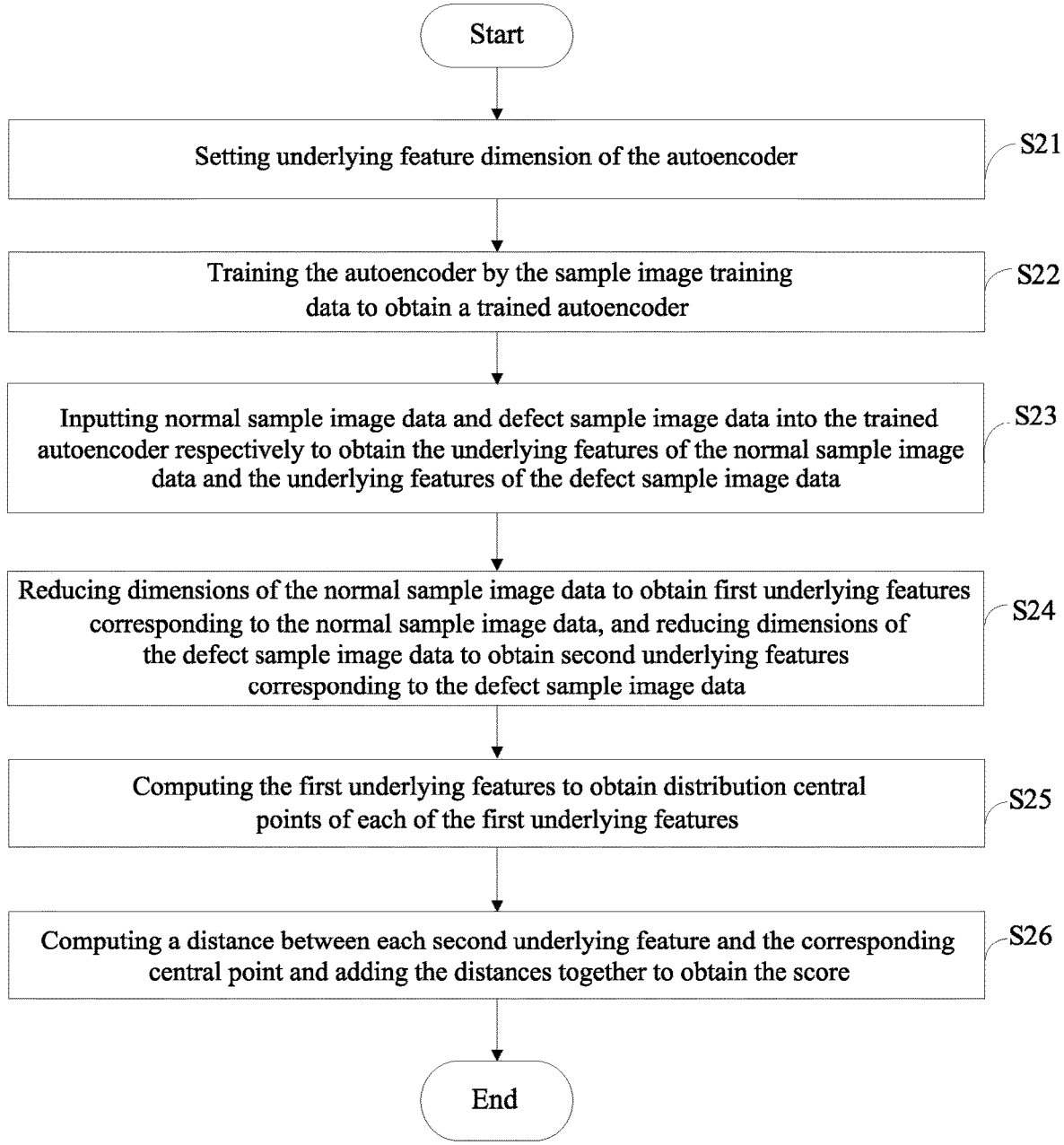
FIG. 2 is a detailed flowchart illustrating an embodiment of block S12 in the method of FIG. 1 according to the present disclosure.

As shown in FIG. 4, the electronic device 6 includes the storage medium 61, the processor 62, and the computer programs 63 stored in the storage medium 61, which can be executed by the processor 62. The processor 62 executes the computer programs 63 to implement the steps of the above method of detecting image defects in the images, as shown in FIGS. 1 and 2. The processor 62 executes the computer programs 63 to implement the functions of the modules or units in the image defect detection apparatus 30 of the present disclosure, as shown in FIG. 3.

For example, the computer programs 63 are divided into one or more modules/units. The one or more modules/units stored in the storage medium 61 are executed by the processor 62 to implement the present disclosure. The one or more modules/units can be multiple computer program instruction sections for implementing a specified function. The instructions are configured to describe an executing process of the computer programs in the electronic device 6. For example, the computer programs 63 are divided into the training data obtaining module 301, the underlying feature dimension selection module 302, the determining module 303, the reconstruction module 304, and the output module 305 as shown in FIG. 3. The functions of the modules reference embodiment two.

In one embodiment, the electronic device 6 can be a desktop computer, a notebook, a handheld computer, a server, and a cloud terminal device. A person skilled in the art may understand that the structure of the electronic device 6 shown in the FIG. 4 constitutes no limitation to the present disclosure, and may include more or fewer components than those shown in the figure, or some components may be combined, or a different component deployment may be used. For example, the electronic device 6 also can include an input/output device, a network access device, a bus, and the like.

The processor 62 can be a central processing unit (CPU), or other universal processor, such as a digital signal processor (DSP), an application specific integrated circuit (ASIC), a field-programmable gate array (FPGA), or other programmable logic component, discrete gate or transistor logic, discrete hardware components, and so on. The universal processor can be a microprocessor or the at least one processor can be any regular processor, or the like. The processor 62 can be a control center of the electronic device 6, for connecting different parts of the whole electronic device 6 by various interfaces and lines.

The storage medium 61 is configured to store the computer programs 63 and the modules/units. The processor 62 runs or executes the computer programs 63 and the modules/units in the storage medium 61, and invokes the data stored in the storage medium 61, to implement various functions of the electronic device 6. The storage medium 61 can include a program storing region and a data storing region. The program storing region can store an operation system, at least one application required by at least one function (such as a sound playing function, an image display function, and the like), and the like. The data storing region can store data created by the electronic device 6 during operations (such as audio data, phone book, and the like), and the like. Besides, the storage medium 61 can be a random-access storage medium, or a non-volatile storage, such as a hard disk, a memory, a plug-in hard disk, a smart media card (SMC), a secure digital (SD), a flash card, a disk storage component, a flash component, or other volatile solid memory.

If the modules/units embedded in the electronic device 6 are implemented in the form of or by means of a software functional unit installed in independent or standalone product, all parts of the integrated modules/units of the storage unit may be stored in a computer-readable storage medium. One or more programs are used to control the related hardware to accomplish all or parts of the methods of this disclosure. The one or more programs can be stored in a computer-readable storage medium. The one or more programs can accomplish the exemplary method when executed by the at least one processor 62. The program codes can be in the form of source code, object code, executable code file, or in some intermediate form. The computer-readable storage medium may include any entity or device capable of carrying the program codes, recording media, USB flash disk, mobile hard disk, disk, computer-readable storage medium, read-only memory (ROM), random access memory (RAM), electric carrier signals, electric signals, software distribution medium, and the like.

Each function module in each embodiment of the present disclosure may be integrated into a processing module, each module may also exist independently and physically, and two or more than two modules may also be integrated into a module. The above-mentioned integrated module may be implemented in a form of hardware and may also be implemented in forms of hardware and software function module.

In the several embodiments provided in the present application, it should be understood that the disclosed apparatus and method may be implemented in other manners. For example, division of the modules is according to their logical function, and there may be other dividing manners in actual implementation.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" do not exclude a plurality, and that a single element. A plurality of modules or devices stated in a claim can alternatively be embodied as a single module or device in software or hardware. The terms "first", "second", etc., represent a name but not any specific order.

The foregoing embodiments are merely intended for describing the technical solutions of the present invention, other than limiting the present invention. Although the present invention is described in detail with reference to the foregoing embodiments, persons of ordinary skill in the art should understand that they may still make modifications to the technical solutions described in the foregoing embodiments, or make equivalent replacements to some technical features of the technical solutions described in the foregoing embodiments; however, these modification or replacements do not make the essence of the corresponding technical solution depart from scope of the technical solutions of the embodiments of the present invention.

What is claimed is:

1. A method of detecting defects in images, applicable in an electronic device; the electronic device comprises a non-transitory storage medium with program codes and a processor; the processor executes the program codes in the non-transitory storage medium to implement the method; the method comprises:

obtaining sample image training data;

selecting an underlying feature dimension of an autoencoder and obtaining a score; the step of selecting a underlying feature dimension of an autoencoder and obtaining a score comprising:

setting the underlying feature dimension of the autoencoder;

training the autoencoder by the sample image training data to obtain a trained autoencoder;

inputting normal sample image data and defect sample image data into the trained autoencoder respectively to obtain underlying features of the normal sample image data and the underlying features of the defect sample image data;

reducing the dimensions of the underlying features of the normal sample image data to obtain first underlying features corresponding to the normal sample image data, and reducing the dimensions of the underlying features of the defect sample image data to obtain second underlying features corresponding to the defect sample image data;

computing the first underlying features to obtain distribution central points of each of first underlying features; and computing a distance between each second underlying feature and the corresponding distribution central point is computed, and adding the distances are added together to obtain the score;

determining whether the score is larger than a standard score; the score being larger than the standard score is set as a new standard score, and re-selecting the underlying feature dimension of the autoencoder to obtain the score; the score being less than or equal to the standard score is considered as an optimal underlying feature dimension;

setting the optimal underlay feature dimension as the underlying feature dimension of the autoencoder, and inputting a test image into the autoencoder to obtain a reconstruction image; and computing a reconstruction error between the test image and the reconstruction image; the test image is outputted as an image revealing defects when the reconstruction error is larger than a predefined threshold; the test image is outputted as a normal image when the reconstruction error is less than or equal to the predefined threshold.

2. The method of claim 1, wherein the step of setting the underlying feature dimension of the autoencoder comprises:

setting the dimension of the underlying feature extracted from an encoding layer of the autoencoder.

3. The method of claim 1, wherein the step of training the autoencoder by the sample image training data to obtain a trained autoencoder comprises:

vectorizing sample image training data to obtain first feature vectors of the sample image training data;

computing the first feature vectors by the encoding layer of the autoencoder to obtain the underlying features of the sample image training data;

computing the underlying features by the encoding layer of the autoencoder and restoring the computed underlying features; and optimizing autoencoder to obtain the trained autoencoder.

4. The method of claim 1, wherein the step of inputting the normal sample image data and the defect sample image data into the trained autoencoder respectively to obtain the underlying features of the normal sample image data and the underlying features of the defect sample image data comprises:

inputting the normal sample image data into the trained autoencoder to obtain the underlying features of the normal sample image data; and inputting the defect sample image data into the trained autoencoder to obtain the underlying features of the defect sample image data.

5. The method of claim 1, wherein the reducing operation is executed by a t-distributed stochastic neighbor embedding algorithm.

6. The method of claim 1, wherein the step of computing the first underlying features to obtain distribution central points of each of first underlying features comprises:

computing an average value in each dimension of three dimensions of each first underlying feature; points corresponding to coordinates combined by the average values of the three dimensions serve as the distribution central points of the first underlying features.

7. The method of claim 6, wherein the step of computing a distance between each second underlying feature and the corresponding distribution central point is computed, and adding the distances are added together to obtain the score comprises:

computing a Euclidean distance between each second underlying feature and the corresponding distribution central point, and adding the Euclidean distances together to obtain the score.

8. An image defect detection apparatus; the image defect detection apparatus comprises a non-transitory storage medium with program codes, which when being executed by a processor, cause the processor to:

obtain sample image training data;

select an underlying feature dimension of an autoencoder and obtain a score; the processor further to:

set the underlying feature dimension of the autoencoder;

train the autoencoder by the sample image training data to obtain a trained autoencoder;

input normal sample image data and defect sample image data into the trained autoencoder respectively to obtain underlying features of the normal sample image data and the underlying features of the defect sample image data;

reduce the dimensions of the underlying features of the normal sample image data to obtain first underlying features corresponding to the normal sample image data, and reduce the dimensions of the underlying features of the defect sample image data to obtain second underlying features corresponding to the defect sample image data;

compute the first underlying features to obtain distribution central points of each of first underlying features; and compute a distance between each second underlying feature and the corresponding distribution central point is computed, and adding the distances are added together to obtain the score;

determine whether the score is larger than a standard score; the score being larger than the standard score is set as a new standard score, and re-selecting the underlying feature dimension of the autoencoder to obtain the score; the score being less than or equal to the standard score is considered as an optimal underlying feature dimension;

set the optimal underlay feature dimension as the underlying feature dimension of the autoencoder, and input a test image into the autoencoder to obtain a reconstruction image; and compute a reconstruction error between the test image and the reconstruction image; the test image is outputted as an image revealing defects when the reconstruction error is larger than a predefined threshold; the test image is outputted as a normal image when the reconstruction error is less than or equal to the predefined threshold.

9. The image defect detection apparatus of claim 8, wherein the processor further to set the dimension of the underlying feature extracted from an encoding layer of the autoencoder.

10. The image defect detection apparatus of claim 8, wherein the processor further:
vectorize sample image training data to obtain first feature vectors of the sample image training data;
compute the first feature vectors by the encoding layer of the autoencoder to obtain the underlying features of the sample image training data;
compute the underlying features by the encoding layer of the autoencoder and restoring the computed underlying features; and
optimize autoencoder to obtain the trained autoencoder.

11. The image defect detection apparatus of claim 8, wherein the reducing operation is executed by a t-distributed stochastic neighbor embedding algorithm.

12. The image defect detection apparatus of claim 8, wherein the processor further:
compute an average value in each dimension of three dimensions of each first underlying feature; points corresponding to coordinates combined by the average values of the three dimensions serve as the distribution central points of the first underlying features.

13. The image defect detection apparatus of claim 12, wherein the processor further:
compute a Euclidean distance between each second underlying feature and the corresponding distribution central point, and add the Euclidean distances together to obtain the score.

14. A computer readable storage medium stores program codes; the program codes are executed by at least one processor to implement the following steps:
obtaining sample image training data;
selecting an underlying feature dimension of an autoencoder and obtaining a score; the step of selecting a underlying feature dimension of an autoencoder and obtaining a score comprising:
setting the underlying feature dimension of the autoencoder;
training the autoencoder by the sample image training data to obtain a trained autoencoder;
inputting normal sample image data and defect sample image data into the trained autoencoder respectively to obtain underlying features of the normal sample image data and the underlying features of the defect sample image data;
reducing the dimensions of the underlying features of the normal sample image data to obtain first underlying features corresponding to the normal sample image data, and reducing the dimensions of the underlying features of the defect sample image data to obtain second underlying features corresponding to the defect sample image data;
computing the first underlying features to obtain distribution central points of each of first underlying features; and
computing a distance between each second underlying feature and the corresponding distribution central point is computed, and adding the distances are added together to obtain the score;
determining whether the score is larger than a standard score; the score being larger than the standard score is set as a new standard score, and re-selecting the underlying feature dimension of the autoencoder to obtain the score; the score being less than or equal to the standard score is considered as an optimal underlying feature dimension;
setting the optimal underlay feature dimension as the underlying feature dimension of the autoencoder, and inputting a test image into the autoencoder to obtain a reconstruction image; and
computing a reconstruction error between the test image and the reconstruction image; the test image is outputted as an image revealing defects when the reconstruction error is larger than a predefined threshold; the test image is outputted as a normal image when the reconstruction error is less than or equal to the predefined threshold.

15. The computer readable storage medium of claim 14, wherein the step of setting the underlying feature dimension of the autoencoder comprises:
setting the dimension of the underlying feature extracted from an encoding layer of the autoencoder.

16. The computer readable storage medium of claim 14, wherein the step of training the autoencoder by the sample image training data to obtain a trained autoencoder comprises:
vectorizing sample image training data to obtain first feature vectors of the sample image training data;
computing the first feature vectors by the encoding layer of the autoencoder to obtain the underlying features of the sample image training data;
computing the underlying features by the encoding layer of the autoencoder and restoring the computed underlying features; and
optimizing autoencoder to obtain the trained autoencoder.

17. The computer readable storage medium of claim 14, wherein the reducing operation is executed by a t-distributed stochastic neighbor embedding algorithm.

18. The computer readable storage medium of claim 17, wherein the step of computing the first underlying features to obtain distribution central points of each of first underlying features comprises:
computing an average value in each dimension of three dimensions of each first underlying feature; points corresponding to coordinates combined by the average values of the three dimensions serve as the distribution central points of the first underlying features.

19. The computer readable storage medium of claim 18, wherein the step of computing a distance between each second underlying feature and the corresponding distribution central point is computed, and adding the distances are added together to obtain the score comprises:
computing a Euclidean distance between each second underlying feature and the corresponding distribution central point, and adding the Euclidean distances together to obtain the score.

* * * * *